US011119404B2

(12) United States Patent
Yang et al.

(10) Patent No.: US 11,119,404 B2
(45) Date of Patent: Sep. 14, 2021

(54) SYSTEM AND METHOD FOR REDUCING PRINTABLE DEFECTS ON EXTREME ULTRAVIOLET PATTERN MASKS

(71) Applicant: KLA Corporation, Milpitas, CA (US)

(72) Inventors: Xiaochun Yang, Fremont, CA (US); Vikram Tolani, San Jose, CA (US); Yao Zhang, Sunnyvale, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/022,973

(22) Filed: Sep. 16, 2020

(65) Prior Publication Data

US 2021/0109440 A1 Apr. 15, 2021

Related U.S. Application Data

(60) Provisional application No. 62/913,659, filed on Oct. 10, 2019.

(51) Int. Cl.

| | |
|---|---|
| ***G03F 1/72*** | (2012.01) |
| ***G03F 1/84*** | (2012.01) |
| ***G03F 1/24*** | (2012.01) |

(52) U.S. Cl.

CPC .................. *G03F 1/72* (2013.01); *G03F 1/24* (2013.01); *G03F 1/84* (2013.01)

(58) Field of Classification Search

CPC ................. G03F 1/24; G03F 1/72; G03F 1/84
USPC .............................................................. 430/5
See application file for complete search history.

(56) References Cited

U.S. PATENT DOCUMENTS

| | | | |
|---|---|---|---|
| 7,743,359 B2 | 6/2010 | Sezginer et al. | |
| 8,473,878 B2 * | 6/2013 | Chow | G03F 1/36 716/55 |
| 8,916,831 B2 | 12/2014 | Wang | |
| 9,268,900 B1 | 2/2016 | Ungar | |
| 10,209,615 B2 | 2/2019 | Li et al. | |
| 10,395,361 B2 | 8/2019 | Sezginer et al. | |
| 2014/0254913 A1 | 9/2014 | Pang | |
| 2015/0117754 A1 | 4/2015 | Nasser-Ghodsi et al. | |
| 2018/0106831 A1 | 4/2018 | Budach et al. | |
| 2019/0033720 A1 | 1/2019 | Yu et al. | |
| 2019/0146355 A1 | 5/2019 | Jheng et al. | |

FOREIGN PATENT DOCUMENTS

| | | |
|---|---|---|
| CN | 107148596 A | 9/2017 |
| JP | 2012064770 A | 3/2012 |
| JP | 2012175080 A | 9/2012 |
| JP | 5425593 B2 | 2/2014 |
| WO | 2014159453 A1 | 10/2014 |

OTHER PUBLICATIONS

Garetto, Anthony D., et al. "Defect mitigation considerations for EUV photomasks." DOI: 10.1117/1.JMM.13.4.043006.

Kagalwalla, Abde Ali H., and Puneet Gupta. "Comprehensive defect avoidance framework for mitigating extreme ultraviolet mask defects." DOI: 10.1117/1.JMM.13.4.043005.

Kagalwalla, Abde Ali, and Puneet Gupta. "Design-aware defect-avoidance floorplanning of EUV masks." DOI: 10.1109/TSM20122234151.

Qi, Zhengqing John, et al. "Viability of pattern shift for defect-free extreme ultraviolet lithography photomasks." DOI: 10.1117/1.JMM.15.2.021005.

Soni, Rakesh Kumar, et al. "Enhancing EUV mask blanks usability through smart shift and blank-design pairing pptimization." DOI: 10.1117/12.2250106.

Zhang, Hongbo, et al. "Efficient pattern relocation for EUV blank defect mitigation." DOI: 10.1109/ASPDAC.2012.6165049.

Zhang, Hongbo, et al. "Layout small-angle rotation and shift for EUV defect mitigation." DOI: 10.1145/2429384.2429394.

PCT International Search Report and Written Opinion for International Application No. PCT/US2020/054325 dated Jan. 29, 2021, 7 pages.

* cited by examiner

*Primary Examiner* — Christopher G Young
(74) *Attorney, Agent, or Firm* — Suiter Swantz pc llo

(57) ABSTRACT

A system for reducing printable defects on a pattern mask is disclosed. The system includes a controller configured to be communicatively coupled to a characterization sub-system, the controller including one or more processors configured to execute program instructions causing the one or more processors to: direct the characterization sub-system to perform inspection of a mask blank; generate a cost function based on a first characteristic and a second characteristic, the first characteristic comprising areas of defect regions exposed by mask patterns, the second characteristic comprising pattern complexity of a design pattern; determine one or more values indicative of a minimum of the cost function via a non-linear optimization procedure; and generate one or more control signals to adjust rotation and translation of the mask blank relative to the design pattern based on the determined one or more values indicative of the minimum of the cost function.

38 Claims, 12 Drawing Sheets

Absorber Layer (602)
Exposure Region (604)

SYSTEM AND METHOD FOR REDUCING PRINTABLE DEFECTS ON EXTREME ULTRAVIOLET PATTERN MASKS

CROSS-REFERENCE TO RELATED APPLICATION

The present application claims priority to U.S. Provisional Application Ser. No. 62/913,659, filed Oct. 10, 2019, entitled FAST METHOD FOR EXTREME ULTRAVIOLET PHOTOMASK BLANK DEFECT OPTIMIZATION, naming Xiaochun Yang, Vikram Tolani, and Yao Zhang as inventors, which is incorporated herein by reference in the entirety.

TECHNICAL FIELD

The present invention generally relates to pattern masks for use in lithography systems, and, more particularly, to a system and method for reducing printable defects on EUV pattern masks using a cost function.

BACKGROUND

Extreme ultraviolet lithography (EUVL) remains the leading technology for Next-Generation Lithography. However, one of the key challenges facing EUVL is mask blank defectivity. EUV masks are Bragg reflectors including several alternating layers of molybdenum and silicon. The design pattern is placed on the top of this multilayer reflector in the form of an absorber layer. Mask blank defects formed during fabrication of the mask blanks significantly alter the design pattern printed on the mask blank that is later transferred onto the sample during EUVL. Repairing these defects is challenging because the defects are buried under the multilayers of the EUV mask blank. Implementation of EUVL for high volume manufacture requires the semiconductor industry to overcome these challenges, however, there currently are no feasible solutions available to produce defect-free mask blanks and no cost-effective tools to repair the buried defects. Therefore, it would be desirable to provide a system and method that cure the shortfalls of the previous approaches identified above.

SUMMARY

A system for reducing printable defects on a pattern mask is disclosed, in accordance with one or more embodiments of the present disclosure. In one embodiment, the system includes a controller configured to be communicatively coupled to a characterization sub-system, the controller including one or more processors configured to execute program instructions causing the one or more processors to: direct the characterization sub-system to perform inspection of a mask blank to generate a defect map of one or more defects in the mask blank; generate a cost function based on a first characteristic and a second characteristic, the first characteristic comprising an area of defect exposure of the one or more defects on the mask blank, the second characteristic comprising pattern complexity of a design pattern within a defect region; determine one or more values indicative of a minimum of the cost function via a non-linear optimization procedure; and generate one or more control signals to adjust rotation and translation of the mask blank relative to the design pattern based on the determined one or more values indicative of the minimum of the cost function.

A system for reducing printable defects on a pattern mask is disclosed, in accordance with one or more embodiments of the present disclosure. In one embodiment, the system includes a controller configured to be communicatively coupled to a characterization sub-system, the controller including one or more processors configured to execute program instructions causing the one or more processors to: direct the characterization sub-system to perform inspection of a mask blank to generate a defect map of one or more defects in the mask blank; generate a cost function based on a first characteristic and a second characteristic, the first characteristic comprising an area of defect exposure of the one or more defects on the mask blank, the second characteristic comprising pattern complexity of a design pattern within a defect region; determine one or more values indicative of a minimum of the cost function via a non-linear optimization procedure; determine one or more metrics indicative of how good the mask blank is for the design pattern; and generate one or more control signals to adjust rotation and translation of the mask blank relative to the design pattern based on at least one of the determined one or more values indicative of the minimum of the cost function or the one or more metrics indicative of how good the mask blank is for the design pattern.

A method for reducing printable defects on a pattern mask is disclosed, in accordance with one or more embodiments of the present disclosure. In one embodiment, the method includes directing a characterization sub-system to perform inspection of a mask blank to generate a defect map of one or more defects in the mask blank. In another embodiment, the method includes generating a cost function based on a first characteristic and a second characteristic, the first characteristic comprising an area of defect exposure of the one or more defects on the mask blank, the second characteristic comprising pattern complexity of a design pattern within a defect region. In another embodiment, the method includes determining one or more values indicative of a minimum of the cost function via a non-linear optimization procedure. In another embodiment, the method includes generating one or more control signals to adjust rotation and translation of the mask blank relative to the design pattern based on the determined one or more values indicative of the minimum of the cost function.

A method for reducing printable defects on a pattern mask is disclosed, in accordance with one or more embodiments of the present disclosure. In one embodiment, the method includes directing a characterization sub-system to perform inspection of a mask blank to generate a defect map of one or more defects in the mask blank. In another embodiment, the method includes generating a cost function based on a first characteristic and a second characteristic, the first characteristic comprising an area of defect exposure of the one or more defects on the mask blank, the second characteristic comprising pattern complexity of a design pattern within a defect region. In another embodiment, the method includes determining one or more values indicative of a minimum of the cost function via a non-linear optimization procedure. In another embodiment, the method includes determining one or more metrics indicative of how good the mask blank is for the design pattern. In another embodiment, the method includes generating one or more control signals to adjust rotation and translation of the mask blank relative to the design pattern based on at least one of the determined one or more values indicative of the minimum of the cost function or the one or more metrics indicative of how good the mask blank is for the design pattern.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

Figure 1A:
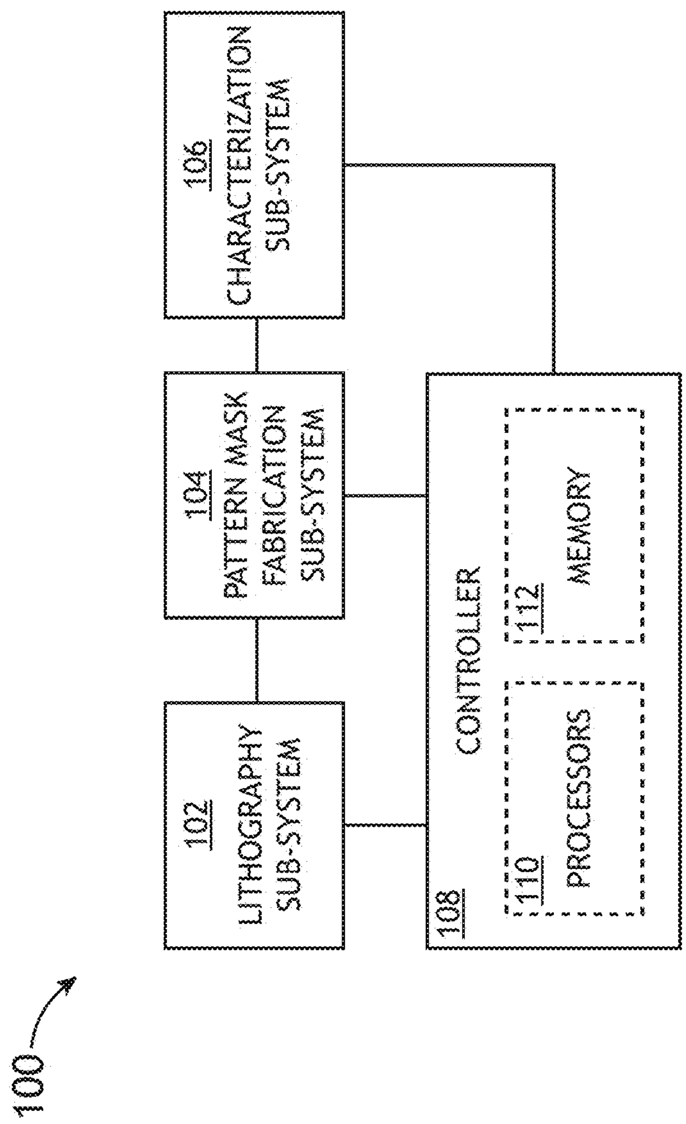
FIG. 1A is a conceptual view illustrating a system for reducing printable defects in pattern masks, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings.

EUVL remains the leading technology for Next-Generation Lithography. However, one of the key challenges facing this technology is mask blank defectivity. Currently, there are no feasible solutions available to produce defect-free mask blanks and no cost-effective tools to repair the defects on the mask blanks. Thus, the ability to tolerate some of these defects without any impacts on yield is crucial. Defect avoidance and mitigation techniques have emerged as a highly effective approach to increase the tolerance of mask defects. Current mask defect mitigation/avoidance methods use the distance between a defect and an absorber edge to compute the impact of the defect on pattern critical dimension, which is not sufficient. Such methods fail to consider extended affected region of defects on complex-pattern areas. A prohibited-shift-rectangle/prohibited-relocation-cube (PSR/PRC) is then computed to find a point that minimizes the number of overlapped PSR/PRC. Alternatively, another approach currently used is to develop an optical model configured to solve a non-convex optimization problem by gradient descend.

Embodiments of the present disclosure are directed to a system and method for reducing printable defects on EUV photomasks, in accordance with one or more embodiments of the present disclosure. Specifically, embodiments of the present disclosure are directed to using a cost function based on the exposure region of defects and pattern complexity, such that the cost function may be configured to mitigate printable mask defects in EUV photomasks used in EUVL. The cost function may be minimized using a fast-non-linear optimization procedure to estimate a set of parameters (e.g., rotation and translation) to optimally hide the one or more defects in the absorber layer. The cost function may be configured to provide one or more defect hiding solutions for EUV mask manufacturing to minimize the impact of mask blank defects to a wafer within a reasonable process time. For example, the system may be configured to suggest a hiding solution such that the mask blank defects are hidden by the absorber layer of the photomask with minimized defect impact on pattern printability. A hidden blank defect (rather than an exposed defect) is less printable in the sample, so its adverse impact on pattern critical dimension is tolerable during fabrication. Further, defect mitigation reduces the wastage of EUV blanks, which are very expensive to produce, thereby improving yielding.

Referring generally to FIGS. 1A-10, a system and method for reducing printable defects on EUV pattern masks using a cost function is described, in accordance with one or more embodiments of the present disclosure.

FIG. 1A is a conceptual view illustrating a system 100 for reducing printable defects on EUV pattern masks using a cost function, in accordance with one or more embodiments of the present disclosure. In one embodiment, the system 100 includes an extreme ultraviolet (EUV) lithography sub-system 102 for lithographically printing one or more patterns to a sample 128. The EUV lithography sub-system 102 may include any lithographic printing tool known in the art. For example, the EUV lithography sub-system 102 may include, but is not limited to, a scanner or stepper. The EUV lithography sub-system 102 may operate by illuminating a pattern mask, which then reflects the illumination according to the mask elements on the pattern mask. Optical elements within the lithography system (e.g., a set of projection optics) may then generate an image of the pattern mask on the sample based on the reflected illumination from the pattern mask collected by the set of projection optics.

In another embodiment, the system 100 includes one or more pattern mask fabrication sub-systems 104 for fabricating pattern masks for use in the EUV lithography sub-system 102. The one or more pattern mask fabrication sub-systems 104 may include any fabrication tool known in the art suitable for pattern mask fabrication. For example, the one or more pattern mask fabrication sub-systems 104 may include, but are not limited to, one or more deposition tools, one or more metrology tools, or the like. The one or more pattern mask fabrication sub-systems 104 may be configured to fabricate any type of pattern mask known in the art including, but not limited to, an extreme ultraviolet pattern mask. The EUV pattern mask may include at least one of a multilayer reflector portion, a capping layer, and an absorber layer. For example, the one or more pattern mask fabrication sub-systems 104 may be configured to generate an EUV pattern mask with an adjusted design pattern based on a cost function, as discussed further herein with respect to FIGS. 4-10.

Figure 5:
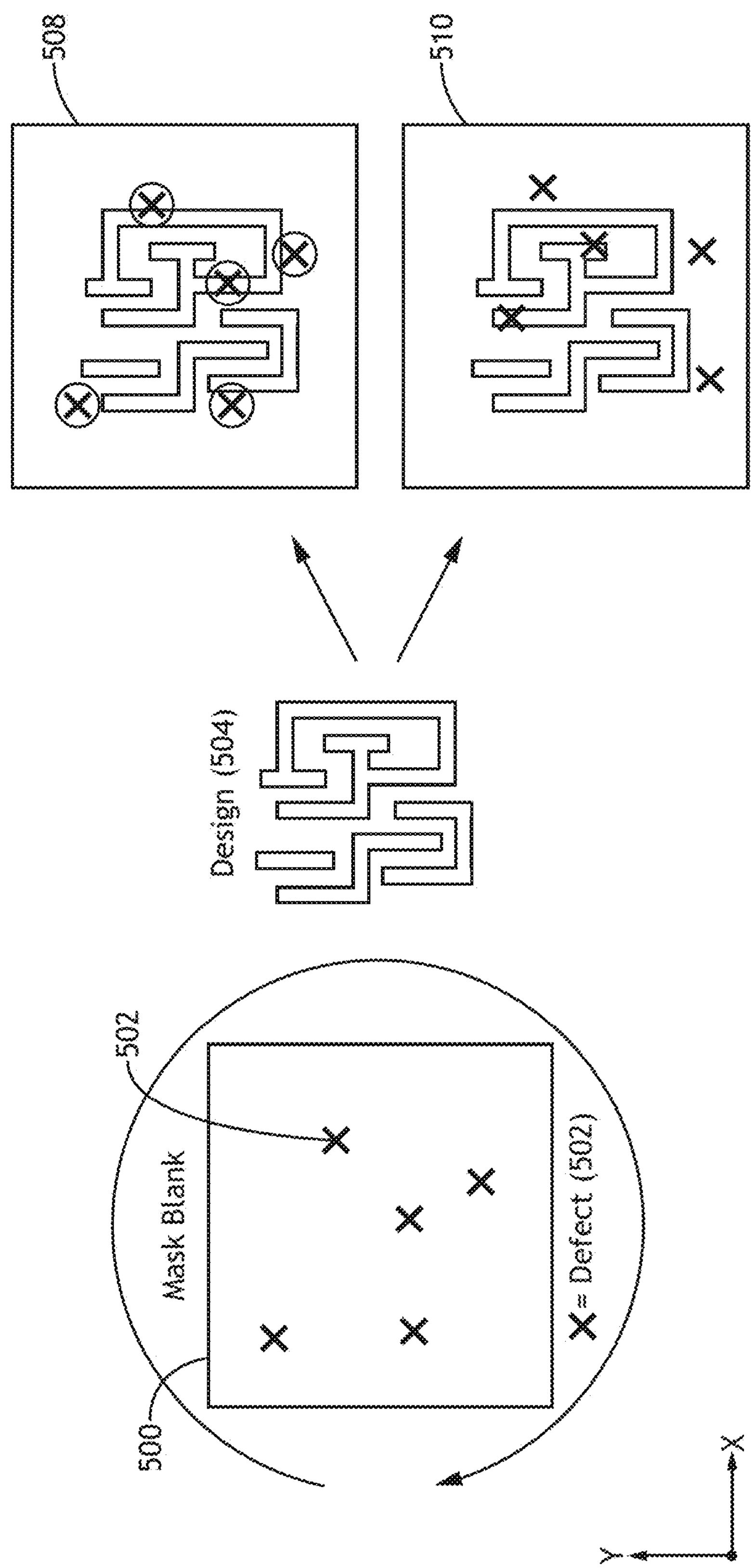
FIG. 5 is a conceptual view illustrating an example of mask blank shifting, in accordance with one or more embodiments of the present disclosure.

In another embodiment, the system 100 includes a characterization sub-system 106 configured to perform defect inspection in a layer of a mask blank 500 (shown in FIG. 5). It is noted herein that the characterization sub-system 106 may include, but is not limited to, an inspection sub-system or a metrology sub-system. The characterization sub-system 106 may include any inspection sub-system 106 known in the art including, but not limited to, an optical-based inspection tool, a charged particle-based inspection tool, a review tool, and the like. The characterization sub-system 106 may include any imaging-based metrology sub-system 106 known in the art including, but not limited to, an optical imaging-based metrology tool, a scanning electron microscopy (SEM) tool, or the like.

In another embodiment, the system 100 includes a controller 108. In another embodiment, the controller 108 includes one or more processors 110 configured to execute program instructions maintained on a memory medium 112. In this regard, the one or more processors 110 of controller 108 may execute any of the various process steps described throughout the present disclosure. Further, the controller 108 may be communicatively coupled to the mask support device 124 and/or the sample stage 130 to direct the transfer of pattern elements on a pattern mask 122 to a sample 128. It is noted herein that the EUV lithography sub-system 102 of the present invention may implement any of the pattern mask designs described throughout the present disclosure.

The characterization sub-system 106 may provide various types of characterization data related to the layers of the mask blank. For example, the characterization sub-system 106 may provide defect characterization data. For instance, the characterization sub-system 106 may provide the location, size, number, or type of defect in the mask blank layers.

Figure 1B:
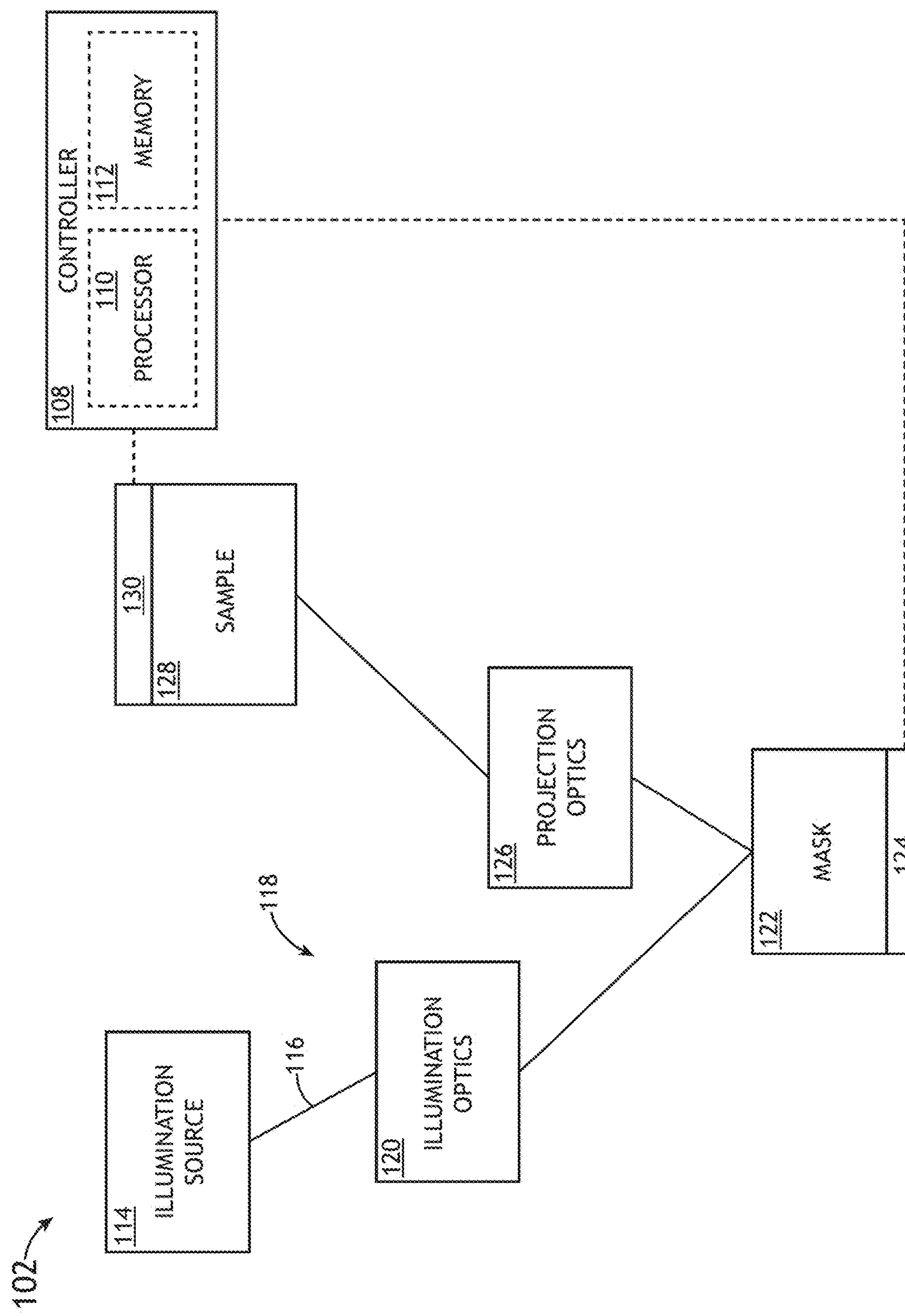
FIG. 1B is a conceptual view illustrating an extreme ultraviolet lithography sub-system, in accordance with one or more embodiments of the present disclosure.

FIG. 1B is a conceptual view illustrating the EUV lithography sub-system 102, in accordance with one or more embodiments of the present disclosure. In one embodiment, the EUV lithography sub-system 102 includes an illumination source 114 configured to generate one or more illumination beams 116. The illumination beam 116 may include one or more selected wavelengths of EUV light. For example, at least a portion of a spectrum of the illumination beam 116 may include wavelengths associated with a EUV-based lithography device suitable for semiconductor fabrication such as, but not limited to, 13.5 nm, or the like. EUV-based lithography is described generally in U.S. Pat. No. 8,916,831 to Wang, issued on Dec. 23, 2014, which is incorporated herein by reference in the entirety.

In one embodiment, the illumination source 114 includes an extreme ultraviolet illumination source 114. For example, the EUV illumination source 114 may include a broadband plasma (BBP) illumination source. In this regard, the illumination beam 116 may include radiation emitted by a plasma. For example, a BBP illumination source 114 may include, but is not required to include, one or more pump sources (e.g., one or more lasers) configured to focus illumination into the volume of a gas, causing energy to be absorbed by the gas in order to generate or sustain a plasma suitable for emitting radiation. Further, at least a portion of the plasma radiation may be utilized as the illumination beam 116. In another embodiment, the illumination source 114 may include one or more lasers capable of emitting radiation at one or more selected wavelengths.

In another embodiment, the illumination source 114 directs the illumination beam 116 to a pattern mask 122 via an illumination pathway 118. The illumination pathway 118 may include one or more illumination optics 120 suitable for directing, focusing, and/or shaping the illumination beam 116 on the pattern mask 122. For example, the illumination optics 120 may include one or more lenses, one or more focusing elements, or the like. Further, the illumination optics 120 may include any reflective optical element known in the art suitable for directing and/or focusing the illumination beam 116. For instance, the illumination optics 120 may include reflective optics suitable for directing and/or focusing low-wavelength light (e.g., EUV light, and the like) such as, but not limited to, flat mirrors or curved mirrors (e.g., elliptical mirrors, parabolic mirrors, or the like).

The illumination optics 120 may further include one or more additional illumination pathway components suitable for shaping the illumination beam 116 and/or controlling a range of incidence angles of the illumination beam 116 on the mask 122 (e.g., an illumination pupil distribution). For example, the illumination pathway components may include, but are not limited to, one or more apertures, one or more apodizers, one or more homogenizers, one or more diffusers, one or more polarizers, or one or more filters.

In another embodiment, the EUV lithography sub-system 102 includes a mask support device 124. The mask support device 124 may be configured to secure the mask 122.

In another embodiment, the EUV lithography sub-system 102 includes a set of projection optics 126 configured to project an image of the pattern mask 122 illuminated by the one or more illumination beams 116 onto the surface of a sample 128 disposed on a sample stage 130. For example, the set of projection optics 126 may be configured to project an image of the pattern mask 122 onto a resist layer on the sample 128 to generate (e.g., expose, or the like) a printed pattern element on the resist layer corresponding to a pattern element on the pattern mask 122. In another embodiment, the mask support device 124 may be configured to actuate or position the pattern mask 122. For example, the mask support device 124 may actuate the pattern mask 122 to a selected position with respect to the projection optics 126 of the EUV lithography sub-system 102.

The pattern mask 122 may be utilized (e.g., by EUV lithography sub-system 102) in any imaging configuration known in the art. For example, the pattern mask 122 may be a positive mask (e.g., a bright-field mask) in which pattern elements are positively imaged as printed pattern elements of a resist layer of sample 128. By way of another example, the pattern mask 122 may be a negative mask (e.g., a dark-field mask) in which pattern elements of the pattern mask 122 form negative printed pattern elements (e.g., gaps, spaces, or the like) of a resist layer of sample 128.

As used throughout the present disclosure, the term "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, pattern mask, mask, and reticle, should be interpreted as interchangeable.

Figure 1C:
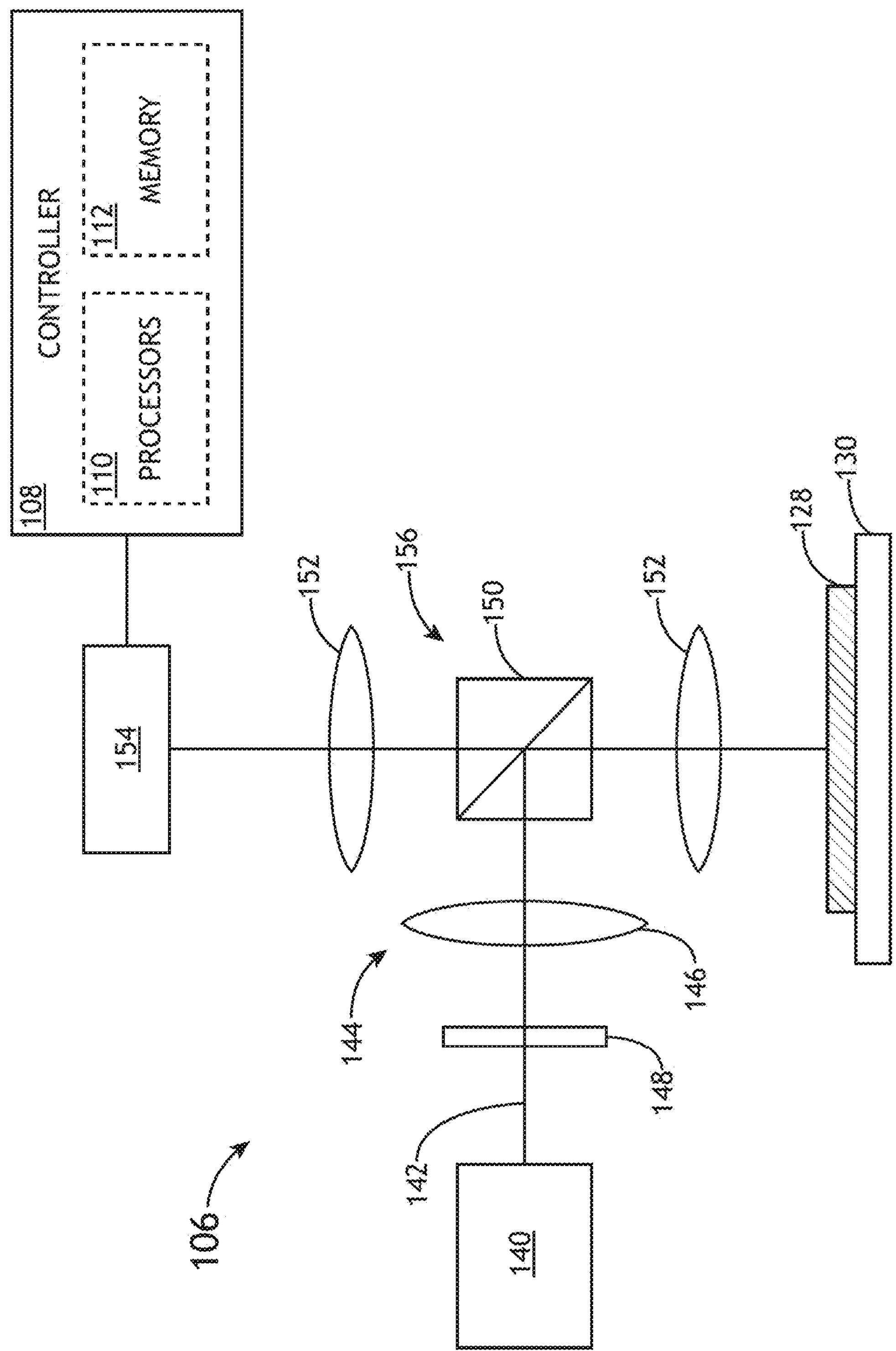
FIG. 1C is a conceptual view illustrating a characterization sub-system, in accordance with one or more embodiments of the present disclosure.

FIG. 1C is a conceptual view illustrating the characterization sub-system 106, in accordance with one or more embodiments of the present disclosure. In one embodiment, the characterization sub-system 106 includes an illumination source 140 to generate an illumination beam 142. The illumination beam 142 may include one or more selected wavelengths of light including, but not limited to, ultraviolet (UV) radiation, visible radiation, or infrared (IR) radiation. It is noted herein that the characterization sub-system 106 may include any type of characterization sub-system 106 known in the art without limiting the scope of the present disclosure. For example, although not depicted in FIG. 1C, the characterization sub-system 106 may include an extreme ultra violet (EUV) characterization sub-system, a deep ultraviolet (DUV) characterization sub-system, or the like without departing from the scope of the present disclosure.

In another embodiment, the illumination source 140 directs the illumination beam 142 to the sample 128 via an illumination pathway 144. The illumination pathway 144 may include one or more lenses 146. Further, the illumination pathway 144 may include one or more additional optical components 148 suitable for modifying and/or conditioning the illumination beam 142. For example, the one or more optical components 148 may include, but are not limited to, one or more polarizers, one or more filters, one or more beam splitters, one or more diffusers, one or more homogenizers, one or more apodizers, or one or more beam shapers. In one embodiment, the illumination pathway 144 includes a beamsplitter 150. In another embodiment, the characterization sub-system 106 includes an objective lens 152 to focus the illumination beam 142 onto the sample 128.

In another embodiment, the characterization sub-system 106 includes one or more detectors 154 configured to capture radiation emanating from the sample 128 through a collection pathway 156. The collection pathway 156 may include multiple optical elements to direct and/or modify illumination collected by the objective lens 152 including, but not limited to one or more lenses 146, one or more filters, one or more polarizers, one or more beam blocks, or one or more beamsplitters.

For example, a detector 154 may receive an image of the sample 128 provided by elements in the collection pathway 156 (e.g., the objective lens 152, the one or more lenses 146, or the like). By way of another example, a detector 154 may receive radiation reflected or scattered (e.g., via specular reflection, diffuse reflection, and the like) from the sample 128. By way of another example, a detector 154 may receive radiation generated by the sample (e.g., luminescence associated with absorption of the illumination beam 142, and the like). Further, it is noted herein that the one or more detectors 154 may include any optical detector known in the art suitable for measuring illumination received from the sample 128. For example, a detector 154 may include, but is not limited to, a CCD detector, a TDI detector, a photomultiplier tube (PMT), an avalanche photodiode (APD), or the like.

In another embodiment, the characterization sub-system 106 is communicatively coupled to the controller 108 of system 100. In this regard, the controller 108 may be configured to receive characterization data such as, but not limited to, defect characterization data.

The one or more processors 110 of a controller 108 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 110 may include any device configured to execute algorithms and/or instructions (e.g., program instructions stored in memory). In one embodiment, the one or more processors 110 may be embodied as a desktop computer, mainframe computer system, workstation, image computer, parallel processor, networked computer, or any other computer system configured to execute a program configured to operate or operate in conjunction with the system 100, as described throughout the present disclosure.

Moreover, different sub-systems of the system 100, such as the sub-systems 102, 104, 106 of system 100, may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller 108 or, alternatively, multiple controllers. Additionally, the controller 108 may include one or more controllers housed in a common housing or within multiple housings. In this way, any controller or combination of controllers may be separately packaged as a module suitable for integration into system 100.

The memory medium 112 may include any storage medium known in the art suitable for storing program instructions executable by the associated one or more processors 110. For example, the memory medium 112 may include a non-transitory memory medium. By way of another example, the memory medium 112 may include, but is not limited to, a read-only memory (ROM), a random-access memory (RAM), a magnetic or optical memory device (e.g., disk), a magnetic tape, a solid-state drive and the like. It is further noted that memory medium 112 may be housed in a common controller housing with the one or more processors 110. In one embodiment, the memory medium 112 may be located remotely with respect to the physical location of the one or more processors 110 and controller 108. For instance, the one or more processors 110 of controller 108 may access a remote memory (e.g., server), accessible through a network (e.g., internet, intranet and the like).

Figure 2B:
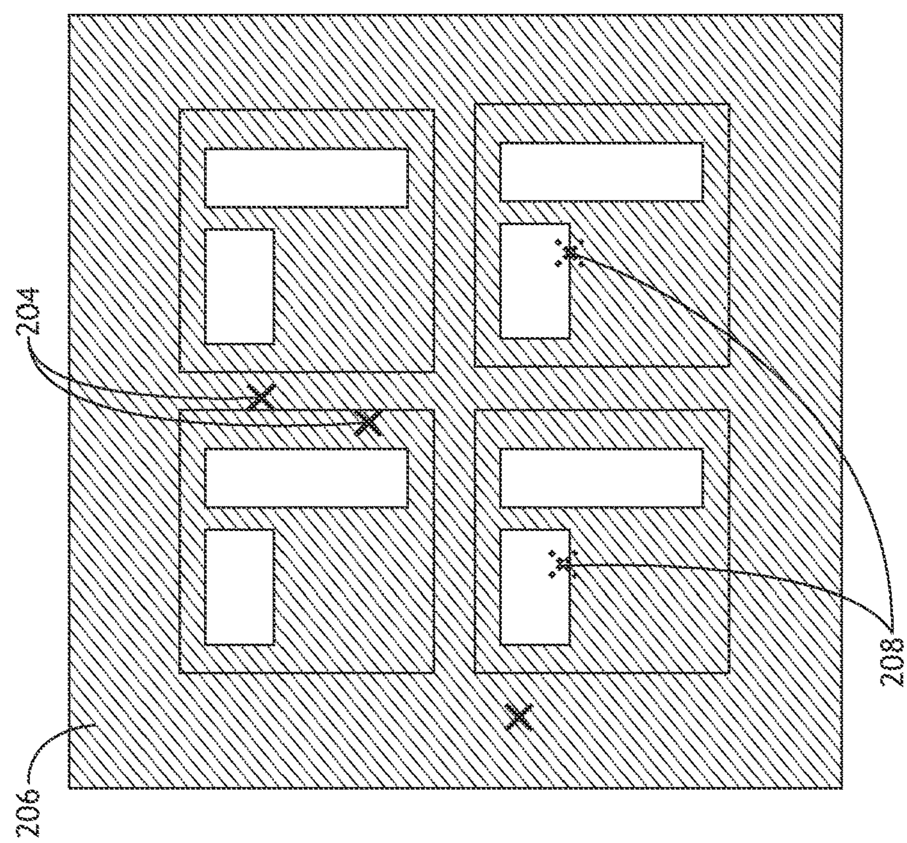
FIG. 2B is a conceptual view illustrating a pattern mask with imperfections after the design pattern has been printed onto the mask blank, in accordance with one or more embodiments of the present disclosure.
Figure 2A:
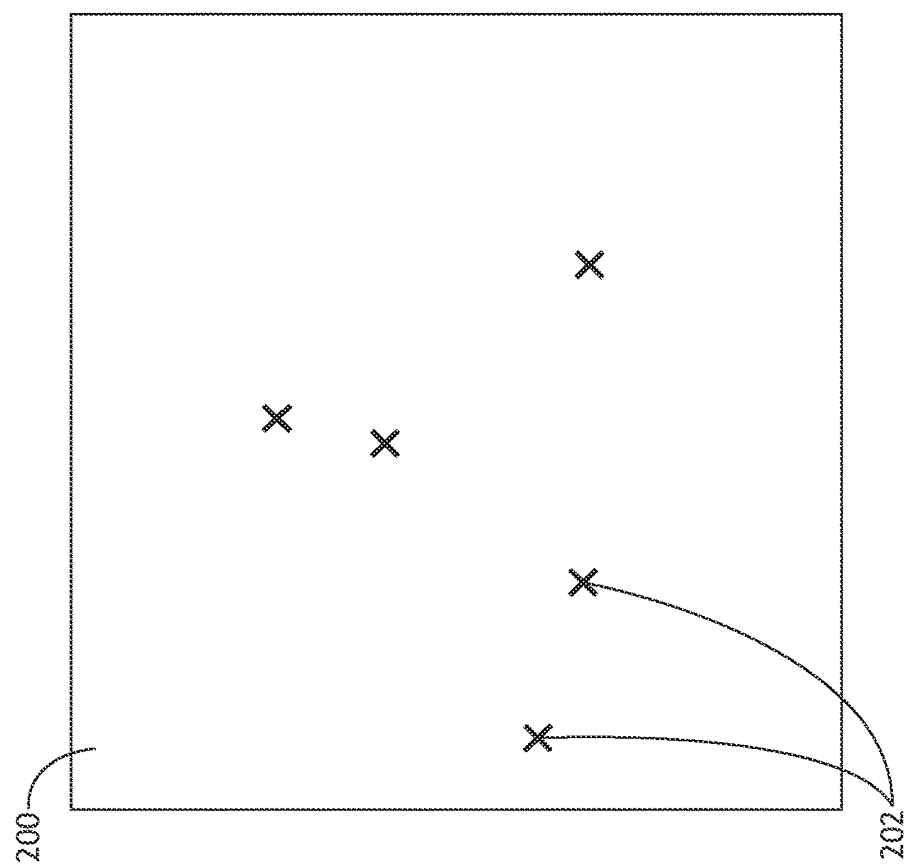
FIG. 2A is a conceptual view illustrating a mask blank with imperfections before a design pattern is printed onto the mask blank, in accordance with one or more embodiments of the present disclosure.

FIGS. 2A-2B illustrate a comparison of pre-pattern and post-pattern imperfections. In one embodiment, one or more defects 202 (or imperfections 202) in the mask blank 200 manifest as one or more defects on the pattern mask 206 after mask fabrication. These defects can be printable after lithography and significantly impact the pattern transferred to the sample. For example, defects 208 may overlap with portions of the exposure region of a design pattern, while other defects 204 may not overlap with the exposure region of the design pattern. The defects 208 that overlap with the exposure region of a pattern may significantly impact the pattern that is transferred to the sample during lithography.

Figures 3A, 3B:
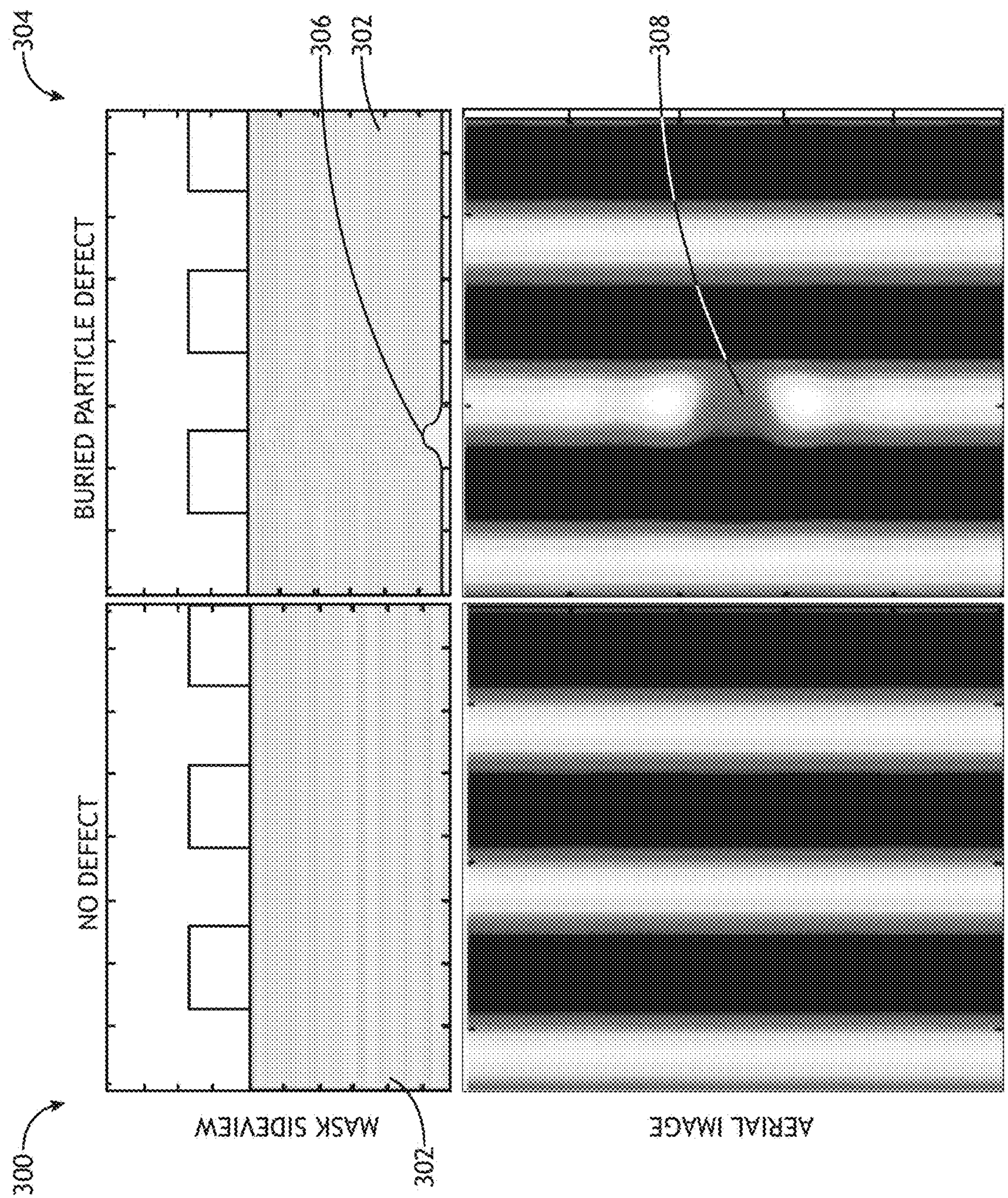
FIG. 3A is a conceptual view illustrating the impact of a transferred mask blank defect on a design pattern of a sample, in accordance with one or more embodiments of the present disclosure.
FIG. 3B is a conceptual view illustrating the impact of a transferred mask blank defect on a design pattern of a sample, in accordance with one or more embodiments of the present disclosure.

FIGS. 3A-3B illustrate the impact of a transferred blank defect on the design pattern of a sample. As previously discussed herein, one key challenge with EUVL is EUV mask blank defectivity. EUV masks are Bragg reflectors including several alternating layers of molybdenum and silicon. A design pattern is placed on the top of this multilayer reflector in the form of an absorber layer. Mask blank defects are formed during fabrication of the blanks. Mask blank defects formed during fabrication of the masks significantly alters the design pattern printed on the sample. FIG. 3A depicts a sample pattern where the mask blank 300 is defect-free and FIG. 3B depicts a sample pattern where the mask blank 304 includes a buried particle defect 306 in the multilayer portion 302 of the mask blank 304. As shown in FIG. 3B, this buried particle defect 306 impacts the design pattern transferred to the sample. For example, as shown in FIG. 3B, the buried particle defect 308 is transferred to the sample and creates a similar defect 308 in the sample pattern. Repairing these defects is very challenging because the defects are buried under multilayers.

Figure 4:
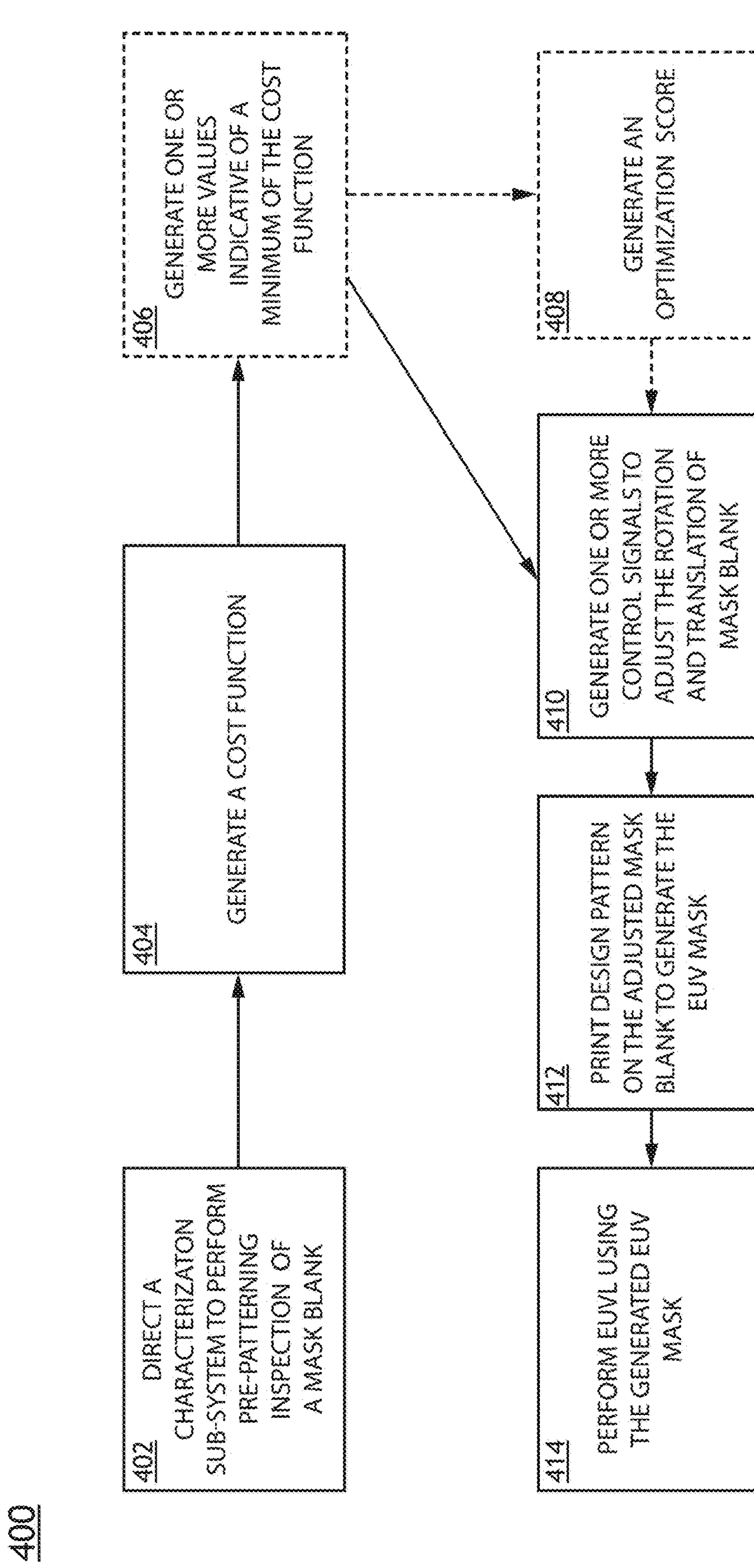
FIG. 4 is a conceptual flow diagram of a method for reducing printable defects in pattern masks, in accordance with one or more embodiments of the present disclosure.

FIG. 4 is a conceptual flow diagram of a method 400 for reducing printable defects in EUV pattern masks, in accordance with one or more embodiments of the present disclosure. It is noted herein that the steps of method 400 may be implemented all or in part by system 100. It is further recognized, however, that the method 400 is not limited to the system 100 in that additional or alternative system-level embodiments may carry out all or part of the steps of method 400.

In one embodiment, the system 100 is configured to perform pre-patterning inspection of a mask blank 500 (step 402). For example, the system 100 may be configured to direct the characterization sub-system 106 to inspect a layer of the mask blank 500. For instance, the characterization sub-system 106 may be configured to generate a defect map (as shown by FIG. 5) of a layer of the mask blank 500 including the location, size, number, and type of the one or more defects 502 in the layers of the mask blank 500. In this regard, the mask blank 500 may be adjusted (rotated and/or translated) to avoid placing the design pattern 504 on the one or more defects 502 on the mask blank 500 (as shown by 510). A bad solution is shown in 508 where the design pattern 504 touches a portion of the one or more defects 502.

In another embodiment, the controller 108 of the system 100 is configured to generate a cost function (step 404), with rotation and translation as parameters, based on a first characteristic and a second characteristic of mask fabrication. For example, the cost function may be based on an area of defect exposure and pattern complexity. For instance, the cost function may be based on a first characteristic including an exposed area of defect (such as the mask 122 shown in FIGS. 1B-1C). In another instance, the cost function may be based on a second characteristic including the pattern complexity of a design pattern within a defect region. It is noted herein that the generated cost function may be configured to avoid high priority defects, hide defects by an absorber layer, and avoid defects on patterns of high complexity.

The cost function may be shown and described by Equation 1 (Eqn. 1):

$$\mathrm{Cost}_\theta(\Delta x,\Delta y)=\Sigma_i W_i(W_A \mathrm{Area}(D_{\theta,i}(\Delta x,\Delta y)\cap P)+W_C\mathrm{Complexity}(D_{\theta,i}(\Delta x,\Delta y)\cap P)) \quad \text{Eqn. 1}$$

where θ is the angle to rotate the defective mask blank 500 around the blank center. In one embodiment, the system 100 is configured to support rotation around the blank center in 90-degree increments. For example, the system 100 may be configured to support a rotation of 0°, 90°, 180°, 270°, or the like around the blank center. It is noted herein that the limit on the angle of rotation may be determined by mask writers. The translation (or shift) of the mask blank 500 relative to the design pattern in the x- and y-direction is represented by Δx, Δy, respectively. It is noted herein that the result of mask blank rotation and/or translation may be included in the output parameters of a suggested solution after the one or more values indicative of a minimum of the cost function are determined (e.g., step 406).

The region of defect under mask rotation and translation is represented by $D_{\theta,i}(\Delta x, \Delta y)$. The intersect operation is represented by operator ∩, and mask patterns are represented by P. As a result, $D_{\theta,i}(\Delta x, \Delta y)\cap P$ represents the exposed area of the defect i with blank rotation and translation as parameters and determined by the mask pattern P, which is represented by polygons (or images).

$W_A$ and $W_C$ are the weights of the exposed area and pattern complexity above the defect, respectively. The weights of each characteristic controls which characteristic is more important than the other characteristic. For example, a higher weight for defect exposure indicates that hiding the defect under the absorber layer is more critical than placing defects on a complex pattern. By way of another example, a higher weight for pattern complexity indicates that avoiding defects on a pattern of high complexity is more critical than defect exposure. It is noted herein that pattern complexity is often more critical because defects on high complexity patterns have a greater impact on pattern critical dimension (CD).

Figure 7B:
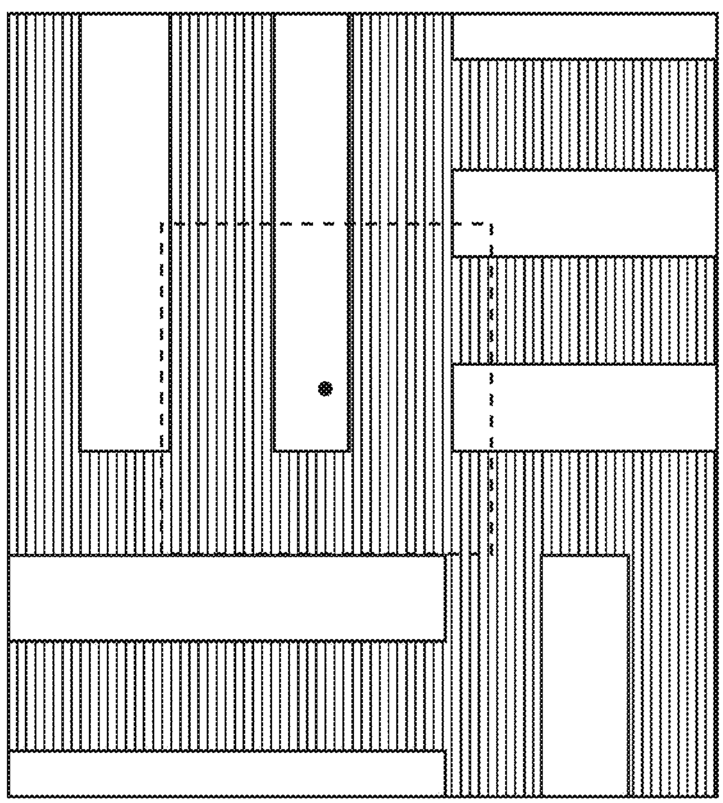
FIG. 7B is a conceptual view illustrating pattern complexity, in accordance with one or more embodiments of the present disclosure.
Figure 7A:
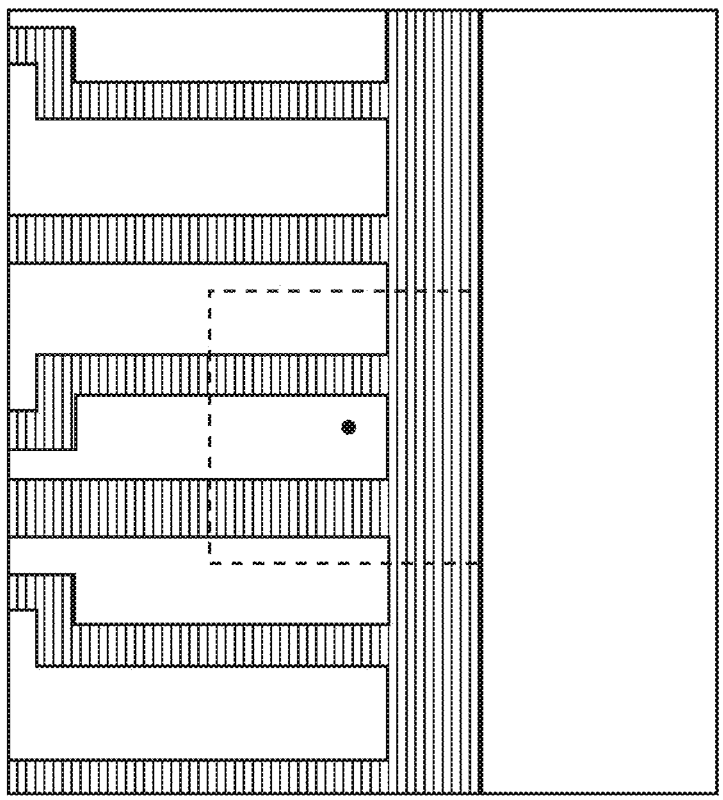
FIG. 7A is a conceptual view illustrating pattern complexity, in accordance with one or more embodiments of the present disclosure.

In one embodiment, the pattern complexity (Complexity $(D_{\theta,i}(\Delta x, \Delta y)\cap P)$) is determined by critical dimension (CD) of patterns in the defect region and density of small-CD patterns within the defect region. For example, as shown in FIGS. 7A-7B, the smaller the pattern CD the higher density of such patterns and thus, the higher its pattern complexity is.

In one embodiment, the area of exposure of a defect (Area$(D_{\theta,i}(\Delta x, \Delta y)\cap P)$) under blank rotation and translation is determined by the part of the defect that is not covered by the absorber layer. For example, the area of defect exposure may be determined using an accumulated overlapping area of one or more defect regions and exposure regions of a design pattern. $\mathrm{Area}(D_{\Theta,i}(\Delta x, \Delta y) \cap P)$ represents a function that computes the ratio of the exposed area of a defect with mask patterns compared to the total defect area. For example, $\mathrm{Area}(D_{\Theta,i}(\Delta x, \Delta y) \cap P)$ may equal 1.0, such that there is full overlap between the defect regions and the exposure regions of mask patterns (e.g., 100 percent exposure). By way of another example, $\mathrm{Area}(D_{\Theta,i}(\Delta x, \Delta y) \cap P)$ may equal 0.0, such that the defect is totally covered by absorber (e.g., zero percent exposure).

$W_i$ represents defect priority based on defect class or type. It is noted herein that some defects are relatively easier to repair. Further, some defects do not affect wafer CD negatively as much as others. In this regard, these defects will be given a lower weight than defects that are difficult to repair (such as buried defects in blank multilayers) or that are more critical to wafer CD. Those defects that are difficult to repair or that are more critical to wafer CD will be given a higher weight to ensure that such defects are maximally hidden by the absorber layer and avoid design patterns of high complexity.

Figure 6:
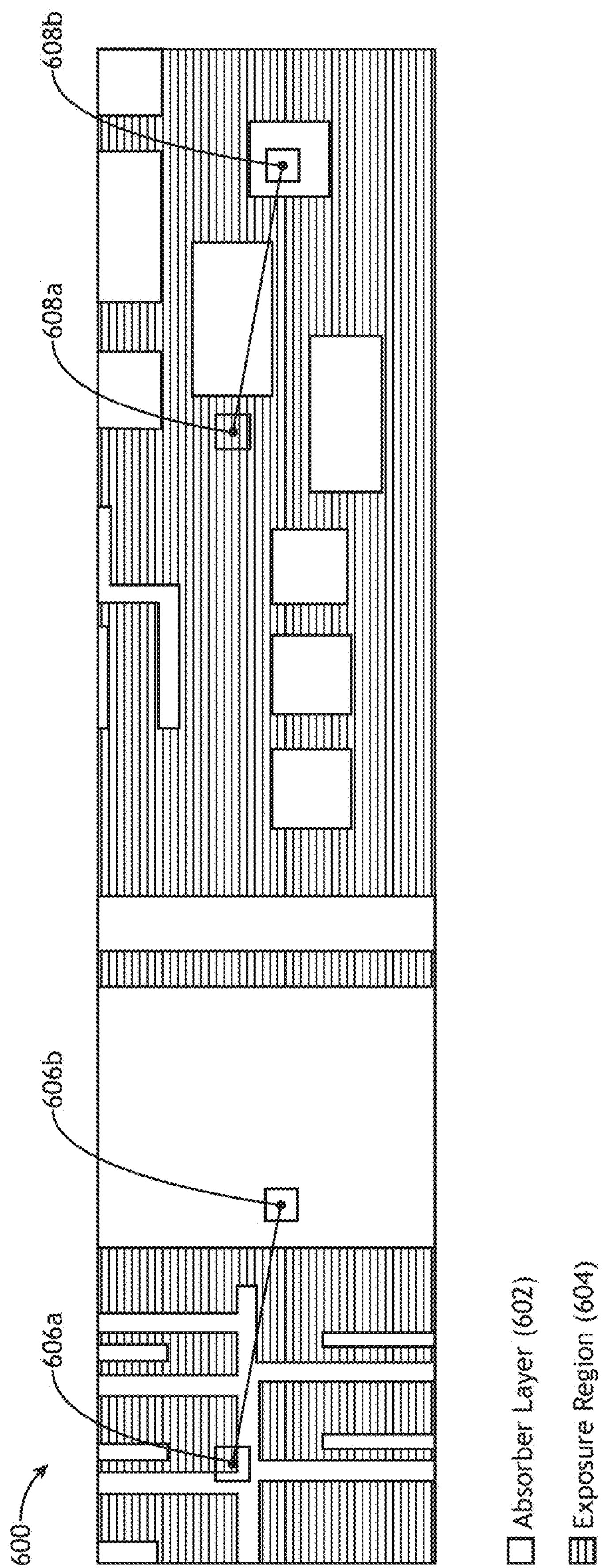
FIG. 6 is a conceptual view illustrating an example of a design pattern shift suggestion based on the cost function, in accordance with one or more embodiments of the present disclosure.

In another embodiment, the system 100 is configured to determine one or more values indicative of a minimum of the cost function using a non-linear optimization procedure (step 406). For example, the controller 108 of the system 100 may be configured to determine the one or more values indicative of the minimum of the cost function using Equation 2 (Eqn. 2). For instance, Eqn. 2 may be configured to determine the optimal parameters of the cost function (e.g., rotation and translation). In this regard, the minimum of the cost function may be configured to suggest to a user an angle to rotate the mask blank. Further, the minimum of the cost function may be configured to suggest to a user an amount to translate (shift) the mask blank in the x- and y-direction (as shown in FIGS. 5-6). For example, the mask blank 500 may be rotated 270 degrees such that the one or more defects 502 do not impact the design pattern 504.

Eqn. 2 is shown and described by:

$$\theta, (\Delta x, \Delta y) = \mathrm{argmin}_{\theta,(\Delta x,\Delta y)} \left\{ \begin{array}{c} Cost_{\theta=0^\circ}(\Delta x, \Delta y) \\ Cost_{\theta=90^\circ}(\Delta x, \Delta y) \\ Cost_{\theta=180^\circ}(\Delta x, \Delta y) \\ Cost_{\theta=270^\circ}(\Delta x, \Delta y) \end{array} \right\} \quad \text{Eqn. 2}$$

In one embodiment, the system 100 utilizes the minimum of the cost function (Eqn. 2) to determine an optimal discrete rotation angle and shift amount such that defects are hidden by an absorber layer, as shown in FIG. 6. In another embodiment, the system 100 utilizes the minimum of the cost function to determine an optimal discrete rotation angle and shift amount such that defects on high complexity patterns are avoided, as shown in FIGS. 7A-7B.

FIG. 6 is a conceptual view illustrating an example of mask blank shifting, in accordance with one or more embodiments of the present disclosure. In one embodiment, the system 100 is configured to adjust the rotation and translation of the mask blank based on the minimum of the cost function determined in step 406. For example, as shown in FIG. 6, the rotation and translation of the mask blank may be adjusted such that the defects are hidden by the absorber layer 602 of the mask 600. For instance, a defect 606*a* located in the exposure region 604 may be hidden under the absorber layer 602 (as indicated by the defect 606*b*) by adjusting the rotation and translation of the mask blank. In another instance, a defect 608*a* located in the exposure region 604 may be hidden under the absorber layer 602 (as indicated by the defect 608*b*) by adjusting the rotation and translation of the mask blank. The optimization result provides the solution of mask blank translation and rotation compared to the original pattern layer design.

In some embodiments, the system 100 is configured to generate one or more metrics indicative of how good the adjusted mask blank is for the design pattern. For example, the controller 108 of the system 100 may be configured to generate one or more metrics indicative of how good the mask blank is for the design pattern (step 408). The one or more metrics indicative of how good the mask blank is for a specified pattern is shown and described by Equations 3-4 (Eqn. 3-4):

$$score_\theta(\Delta x, \Delta y) = \frac{\sum_i \mathrm{metrics}(D_{\theta,i}(\Delta x, \Delta y))}{N} \quad \text{Eqn. 3}$$

$$\mathrm{metrics}\left(D_{\theta,i}(\Delta x, \Delta y) = e^{-\frac{10}{max(W_A, W_C)}\left(W_A\, Area\left(D_{\theta,i}(\Delta x,\Delta y) \cap P\right) + W_C\, Complexity\left(D_{\theta,i}(\Delta x,\Delta y) \cap P\right)\right)}\right) \quad \text{Eqn. 4}$$

where N is the total number of defects. In one embodiment, the one or more metrics includes a score between 0 and 1. For example, the controller 108 of the system 100 may be configured to determine a score between 0 and 1 using Eqns. 3-4. A score closer to 1 indicates that the mask blank is a good match for the specified design pattern P. The score gives a user an intuitive indication of how good the blank is for the mask pattern P. It is noted herein that this score may be used by a user to select the best suitable mask blank from a mask library for a given mask pattern P. For example, the best mask blank from a mask blank library may be selected so that all mask blanks are best utilized. Thus, it can maximally reduce blank wastage and greatly improve the yield in production environment.

In one embodiment, the system 100 is configured to generate one or more control signals to adjust the rotation and translation of the mask blank relative to a design pattern (step 410). For example, the one or more control signals may be generated based on the minimum of the cost function. For instance, the minimum of the cost function may include an optimal rotation and translation amount such that the defects will be hidden by an absorber layer when the design pattern is written on the mask blank.

In some embodiments, the one or more pattern mask fabrication sub-systems 104 of the system 100 may be configured to print the adjusted design pattern on the mask blank 500 to generate the EUV mask (such as the mask 122 shown in FIGS. 1B-1C) (step 412). For instance, the one or more pattern mask fabrication sub-systems 104 may be configured to print the adjusted pattern on the mask blank such that the one or more defects on the mask blank are hidden by an absorber layer of the mask blank. In this regard, the one or more blank defects are hidden such that they do not significantly impact the pattern transferred to the sample.

It is noted herein that utilizing the cost function shown and described by Eqn. 1 allows for a user to perform blank defect optimization within a reasonable amount of time. For example, for approximately 120 defects, the runtime of the system 100 may be approximately 1 minute and 33 seconds.

By way of another example, for approximately 1000 defects, the runtime of the system 100 may be approximately 30 minutes.

Figure 8:
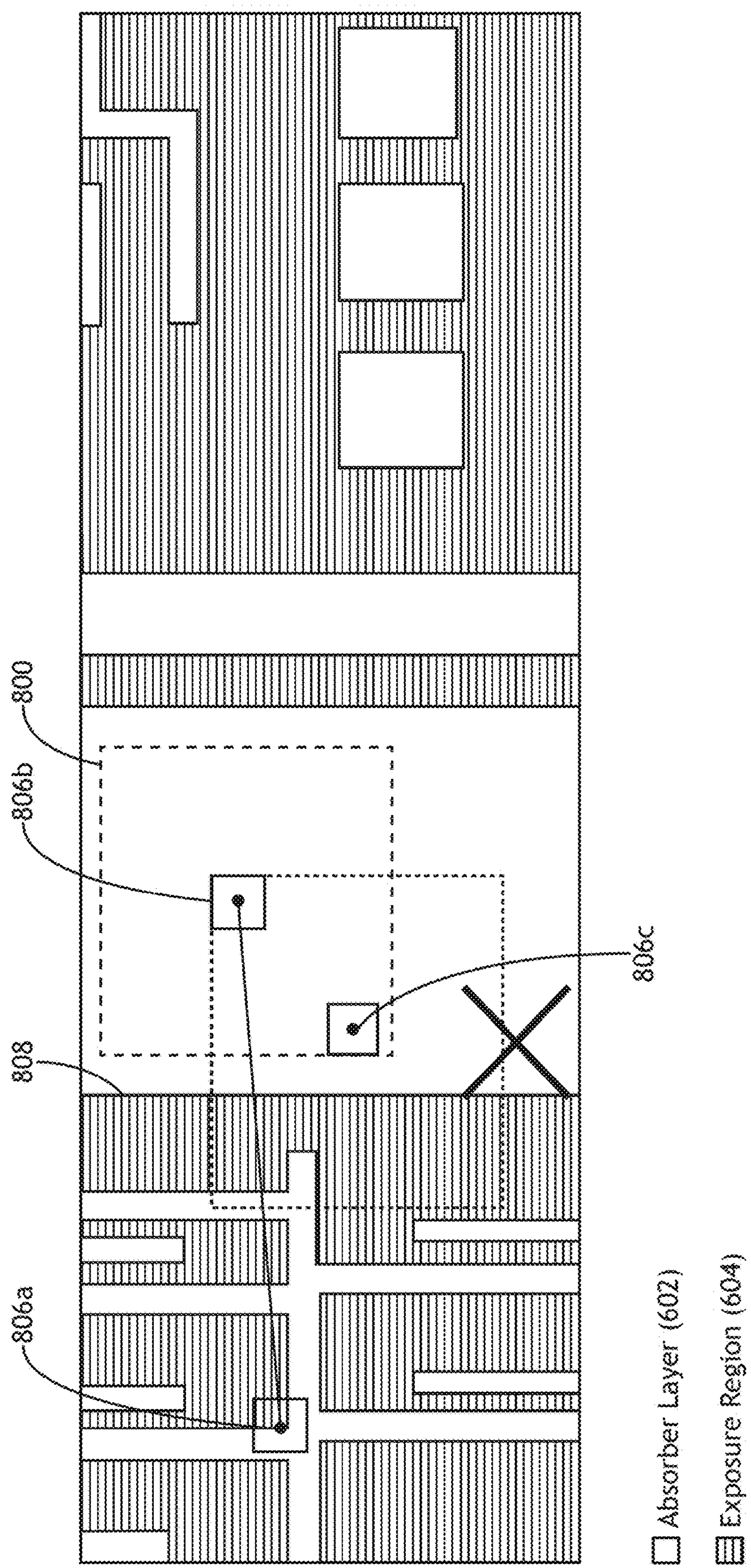
FIG. 8 is a conceptual view illustrating the adding a margin to the mask blank defect, in accordance with one or more embodiments of the present disclosure.

It is noted herein that it may be desirable to position defects a select distance away from an absorber edge, since even defects hidden by an absorber layer may be exposed if they are too close to the absorber edge. Further, such defects may also affect wafer CD. In some embodiments, as shown in FIG. 8, the defects may be extended by adding a margin 800 to defect size in the cost function. For example, during cost function optimization (step 406), the optimizer may shift the mask blank more than it would otherwise be shifted (e.g., as shown by 806*b* and 806*c* in FIG. 8), such that defects are positioned a select distance away from absorber edge 808. For instance, the optimizer may shift the mask blank such that the defect 806*a* is positioned at point 806*b*, rather than at position 806*c*, such that the defect is positioned further away from the absorber edge 808.

In some embodiments, the system 100 is configured to perform EUV lithography (EUVL) (step 414) using the EUV mask generated in step 412. For example, the EUV lithography sub-system 102 may be configured to perform EUV lithography using the EUV mask to transfer the design pattern on the EUV mask to the sample 128.

In an additional/alternative embodiment, pattern complexity may be calculated from one or more simulated aerial images. For example, an aerial image may be obtained from a design pattern by forward lithography simulation. In this regard, pattern complexity then may be computed through log slope of the simulated aerial image.

Figure 9:
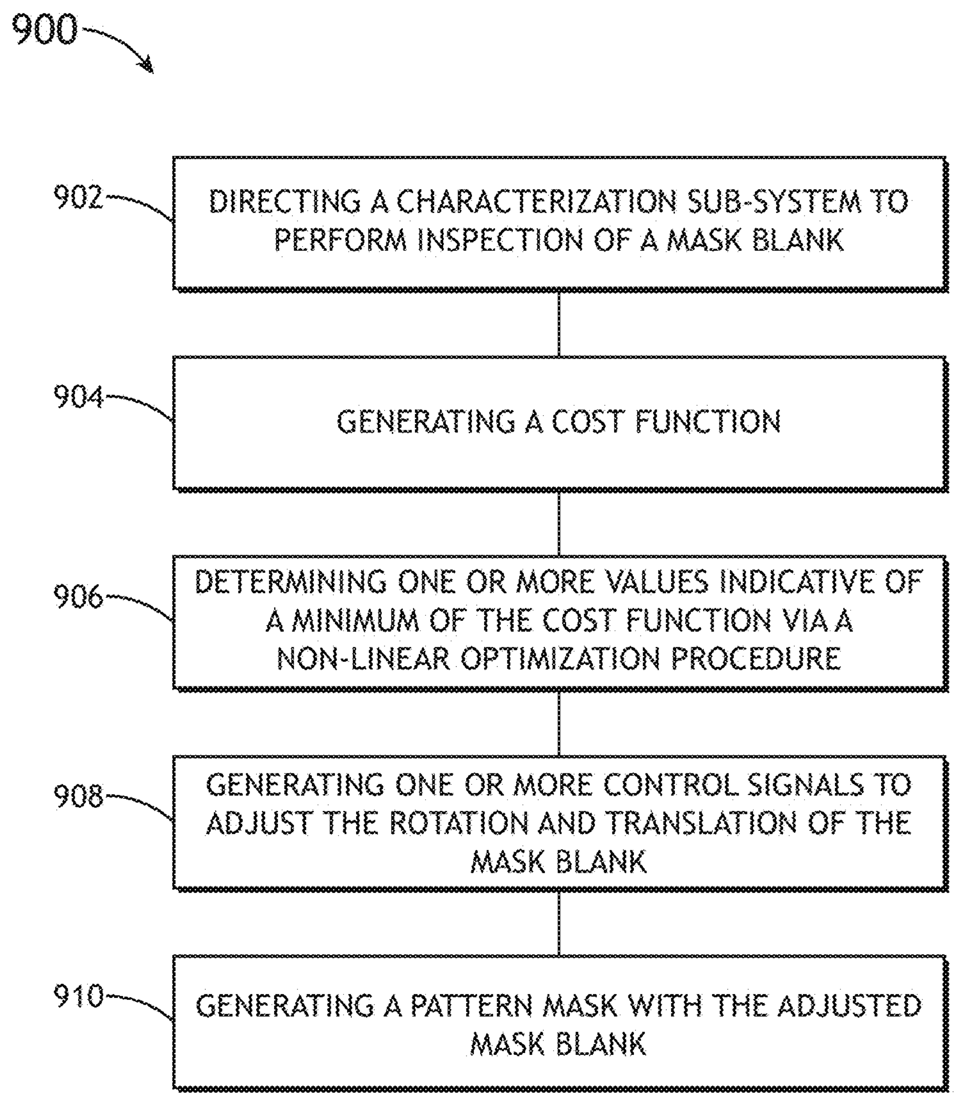
FIG. 9 illustrates a flow chart of a method for reducing printable defects in pattern masks using a cost function, in accordance with one or more embodiments of the present disclosure.

FIG. 9 illustrates a flowchart of a method 900 for reducing printable defects in EUV photomasks using a cost function, in accordance with one or more embodiments of the present disclosure. It is noted herein that the steps of method 900 may be implemented all or in part by system 100. It is further recognized, however, that the method 900 is not limited to the system 100 in that additional or alternative system-level embodiments may carry out all or part of the steps of method 900.

In step 902, blank inspection of the mask blank 500 is performed to generate a defect map. In one embodiment, the system 100 is configured to direct the characterization sub-system 106 to perform pre-pattern inspection of the mask blank to generate a defect map of layers of the mask blank 500. For example, the characterization sub-system 106 may be configured to identify the number, size, type, and location of one or more defects 502 in the mask blank 500.

In step 904, a cost function is generated with rotation and translation as parameters. In one embodiment, the controller 108 of the system 100 is configured to generate a cost function based on a first characteristic and a second characteristic of the cost function (such as the cost function shown in Eqn. 1) with rotation and translation as parameters of the cost function. For example, the first characteristic of the cost function may include an exposed area of defect regions on the mask blank. By way of another example, the second characteristic of the cost function may include the pattern complexity of a design pattern under which a defect lies.

In one embodiment, the system 100 is configured to determine pattern complexity by CD of patterns in the defect region and density of small-CD patterns within the defect region. In another embodiment, the system 100 is configured to determine the exposed area of defects under an exposure region of the design pattern using the part of the defect that is not covered by the absorber layer.

In step 906, one or more values indicative of the minimum of the cost function are generated via a non-linear optimization procedure. In one embodiment, the cost function is minimized by the non-linear optimization procedure to determine one or more optimal rotation and translation parameters using the controller 108 of the system 100. For example, the cost function may be minimized using Bound Optimization BY Quadratic Approximation (BOBYQA) to determine the parameters of rotation and translation (as shown by Eqn. 2). For instance, the minimum of the cost function may indicate that a mask blank with a specific pattern should be rotated 90 degrees relative to the mask blank center and shifted approximately −1.1268 μm in the x-direction and 0.1956 μm in the y-direction.

It is noted herein that any non-linear optimization procedure may be used. Therefore, the above description should not be construed as limiting the scope of the present disclosure.

In step 908, one or more control signals are generated to adjust the rotation and translation of the mask blank relative to the design pattern based on the one or more values determined in step 906. For example, as shown in FIG. 5, mask blank 500 may be rotated and translated a select amount based on the optimal rotation and translation parameters of the minimum of the cost function, such that the defects 502 on the mask blank 500 do not lay under the exposure areas of a design pattern 504 (e.g., are hidden by the absorber layer).

In step 910, the mask is generated with the adjusted design pattern to perform photolithography of a sample. For example, the mask generated may be an EUV photomask to be used by an EUV lithography sub-system (such as the EUV lithography sub-system 102 shown in FIGS. 1B-1C).

Figure 10:
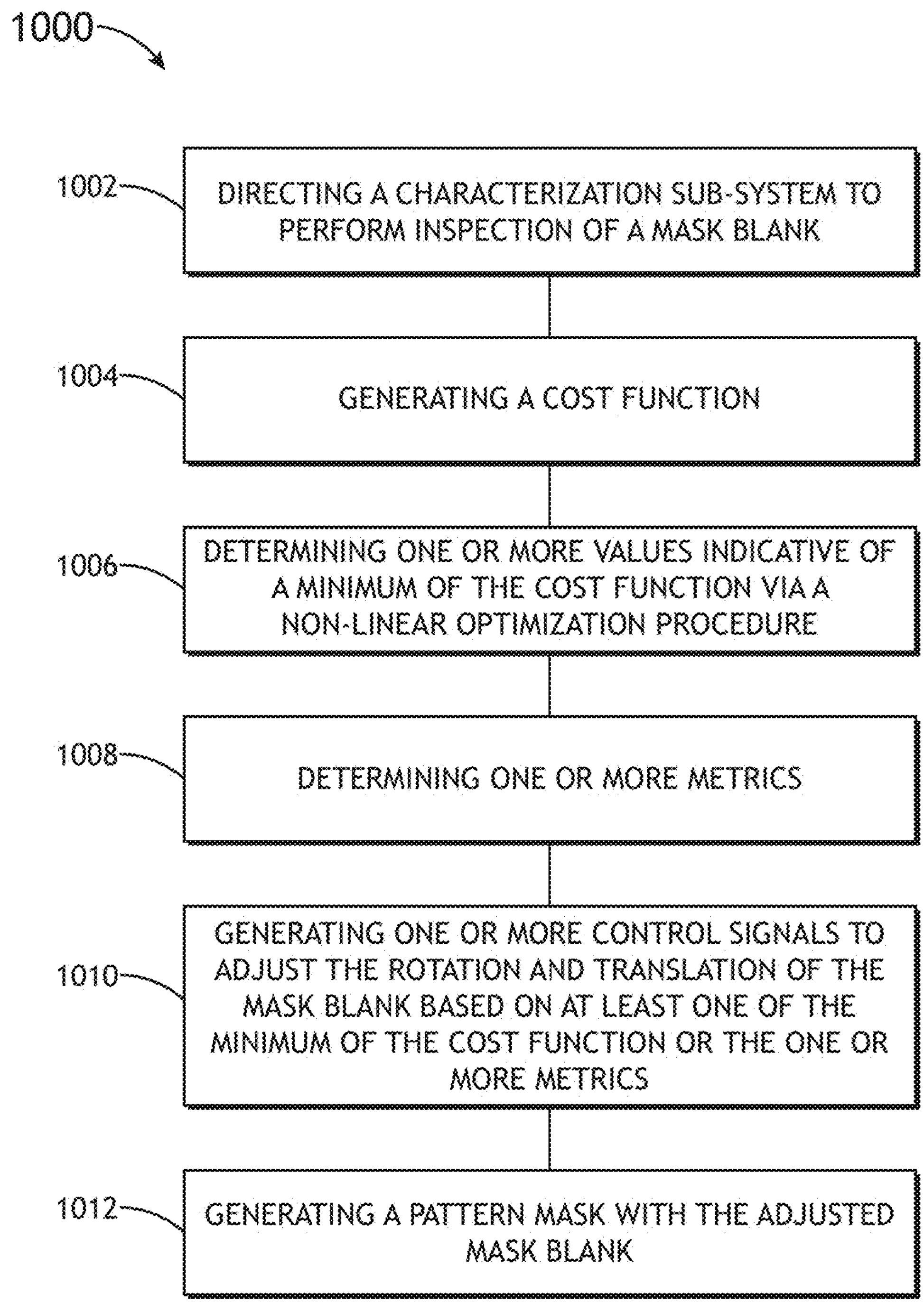
FIG. 10 illustrates a flow chart of a method for reducing printable defects in pattern masks using a cost function, in accordance with one or more embodiments of the present disclosure.

FIG. 10 illustrates a flowchart of an additional/alternative method 1000 for reducing printable defects in EUV photomasks using a cost function, in accordance with one or more embodiments of the present disclosure. It is noted herein that the steps of method 1000 may be implemented all or in part by system 100. It is further recognized, however, that the method 1000 is not limited to the system 100 in that additional or alternative system-level embodiments may carry out all or part of the steps of method 1000.

In step 1002, blank inspection of the mask blank 500 is performed to generate a defect map. In one embodiment, the system 100 is configured to direct the characterization sub-system 106 to generate a defect map of a layer of the mask blank 500. For example, the characterization sub-system 106 may be configured to identify the number of defects, their size, type, and location in the mask blank 500.

In step 1004, a cost function is generated with rotation and translation as parameters. In one embodiment, the controller 108 of the system 100 is configured to generate a cost function based on a first characteristic and a second characteristic of the cost function (such as the cost function shown by Eqn. 1). For example, the first characteristic of the cost function may include an exposed area of defect regions on the mask blank. By way of another example, the second characteristic of the cost function may include pattern complexity of a design pattern within a defect region.

In step 1006, one or more values indicative of the minimum of the cost function are generated via a non-linear optimization procedure. In one embodiment, the cost function is minimized by the non-linear optimization procedure to find the parameters of rotation and translation. For example, the cost function may be minimized using Bound Optimization BY Quadratic Approximation (BOBYQA) to determine the optimal parameters of rotation and translation.

It is noted herein that any non-linear optimization procedure may be used. Therefore, the above description should not be construed as limiting the scope of the present disclosure.

In step 1008, one or more metrics indicative of how good the adjusted mask blank is for a specific design pattern are generated. For example, the controller 108 of the system 100 may be configured to generate one or more metrics indicative of how good the mask blank is for the design pattern using Eqns. 3-4, described previously herein. In one embodiment, the one or more metrics include a score between 0 and 1. For example, the controller 108 of the system 100 may be configured to determine a score between 0 and 1 using Eqns. 3-4. A score closer to 1 indicates that the adjusted mask blank with the design pattern is more likely to mitigate the one or more defects on the mask blank. For example, a score of 1 indicates that the adjusted mask blank with the design pattern mitigates the one or more defects on the mask blank, while a score of 0 indicates that the adjusted mask blank with the design pattern does not mitigate the one or more defects on the mask blank well. In this regard, the score gives a user an intuitive indication of how good the blank is for the mask pattern P and how the pattern mask will effectively hide one or more of the defects in the blank.

In step 1010, one or more control signals are generated to adjust the rotation and translation of the mask blank based on the estimated parameters of the minimum of the cost function determined in step 1006 or the one or more metrics indicative of how good the adjusted mask blank is for a specific pattern determined in step 1008. For example, the best mask blank from a mask blank library may be selected using the one or more metrics determined in step 1008, so that all mask blanks are best utilized based on a specified pattern. For instance, the controller 108 of the system 100 may be configured to obtain the highest score of 0.9355 among mask blanks with a specific mask pattern after optimization (e.g., once the mask blank has been rotated 90 degrees with a translation of −1.1268 μm in the x-direction and 0.1956 μm in the y-direction). In this instance, the highest score indicates that the mask blank is the best pair for the design pattern after the mask blank has been rotated 90 degrees and translated −1.1268 μm in the x-direction and 0.1956 μm in the y-direction. Thus, it can maximally reduce blank wastage and greatly improve the yield in production environment.

In step 1012, the mask is generated with the adjusted mask blank to perform photolithography of a sample. For example, the mask generated may be an EUV photomask to be used by an EUV lithography sub-system (such as the lithography sub-system 102 shown in FIGS. 1B-1C).

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system for reducing printable defects on a pattern mask, comprising:

a controller configured to be communicatively coupled to a characterization sub-system, wherein the controller includes one or more processors configured to execute program instructions causing the one or more processors to:

direct the characterization sub-system to perform inspection of a mask blank to generate a defect map of one or more defects in the mask blank;

generate a cost function based on a first characteristic and a second characteristic, wherein the first characteristic comprises an area of defect exposure of the one or more defects on the mask blank, wherein the second characteristic comprises pattern complexity of a design pattern within a defect region;

determine one or more values indicative of a minimum of the cost function via a non-linear optimization procedure; and generate one or more control signals to adjust rotation and translation of the mask blank relative to the design pattern based on the determined one or more values indicative of the minimum of the cost function.

2. The system of claim 1, wherein the controller is further configured to:

determine one or more metrics indicative of how good the adjusted mask blank is for the design pattern.

3. The system of claim 2, wherein the one or more metrics includes a score between 0 and 1, wherein a score closer to 1 indicates that the adjusted mask blank with the design pattern is more likely to mitigate the one or more defects on the mask blank.

4. The system of claim 1, wherein the controller is further configured to:

add a margin to the size of the one or more defects in the mask blank, wherein the addition of the margin is configured to position the one or more defects a select distance from one or more edges of the design pattern.

5. The system of claim 1, wherein the rotation and translation of the mask blank is further configured to avoid placing the one or more defects on the mask blank under design patterns of high complexity.

6. The system of claim 1, wherein the pattern complexity of the design pattern is determined by pattern critical dimension in the defect region of the one or more defects on the mask blank and density of small-critical dimension patterns in the defect region of the one or more defects on the mask blank.

7. The system of claim 1, wherein the area of defect exposure of the one or more defects on the mask blank is determined using an overlapping area of one or more defect regions with exposure regions of the design pattern.

8. The system of claim 1, wherein the non-linear optimization procedure includes Bound Optimization BY Quadratic Approximation (BOBYQA).

9. The system of claim 1, wherein the mask blank includes an extreme ultraviolet blank mask.

10. The system of claim 1, wherein the design pattern is printed on the adjusted mask blank to generate the pattern mask, wherein the pattern mask includes an extreme ultraviolet pattern mask including a multilayer reflector portion and an absorber layer.

11. A system for reducing printable defects on a pattern mask, comprising:

a controller configured to be communicatively coupled to a characterization sub-system, wherein the controller includes one or more processors configured to execute program instructions causing the one or more processors to:

direct the characterization sub-system to perform inspection of a mask blank to generate a defect map of one or more defects in the mask blank;

generate a cost function based on a first characteristic and a second characteristic, wherein the first characteristic comprises an area of defect exposure of the one or more defects on the mask blank, wherein the second characteristic comprises pattern complexity of a design pattern within a defect region;

determine one or more values indicative of a minimum of the cost function via a non-linear optimization procedure;

determine one or more metrics indicative of how good the mask blank is for the design pattern; and generate one or more control signals to adjust rotation and translation of the mask blank relative to the design pattern based on at least one of the determined one or more values indicative of the minimum of the cost function or the one or more metrics indicative of how good the mask blank is for the design pattern.

12. The system of claim 11, wherein the one or more metrics includes a score between 0 and 1, wherein a score closer to 1 indicates that the adjusted mask blank with the design pattern is more likely to mitigate the one or more defects on the mask blank.

13. The system of claim 11, wherein the controller is further configured to:

add a margin to the size of the one or more defects in the mask blank, wherein the addition of the margin is configured to position the one or more defects a select distance from one or more edges of the design pattern.

14. The system of claim 11, wherein the rotation and translation of the mask blank is further configured to avoid placing the one or more defects on the mask blank under design patterns of high complexity.

15. The system of claim 11, wherein the pattern complexity of the design pattern is determined by pattern critical dimension in the defect region of the one or more defects on the mask blank and density of small-critical dimension patterns in the defect region of the one or more defects on the mask blank.

16. The system of claim 11, wherein the area of defect exposure of the one or more defects on the mask blank is determined using an overlapping area of one or more defect regions with exposure regions of the design pattern.

17. The system of claim 11, wherein the non-linear optimization procedure includes Bound Optimization BY Quadratic Approximation (BOBYQA).

18. The system of claim 11, wherein the mask blank includes an extreme ultraviolet blank mask.

19. The system of claim 11, wherein the design pattern is printed on the adjusted mask blank to generate the pattern mask, wherein the pattern mask includes an extreme ultraviolet pattern mask including a multilayer reflector portion and an absorber layer.

20. A method for reducing printable defects on a pattern mask, comprising:

directing a characterization sub-system to perform inspection of a mask blank to generate a defect map of one or more defects in the mask blank;

generating a cost function based on a first characteristic and a second characteristic, wherein the first characteristic comprises an area of defect exposure of the one or more defects on the mask blank, wherein the second characteristic comprises pattern complexity of a design pattern within a defect region;

determining one or more values indicative of a minimum of the cost function via a non-linear optimization procedure; and generating one or more control signals to adjust rotation and translation of the mask blank relative to the design pattern based the determined one or more values indicative of the minimum of the cost function.

21. The method of claim 20, wherein the method further comprises:

determining one or more metrics indicative of how good the adjusted mask blank is for the design pattern.

22. The method of claim 21, wherein the one or more metrics includes a score between 0 and 1, wherein a score closer to 1 indicates that the adjusted mask blank with the design pattern is more likely to mitigate the one or more defects on the mask blank.

23. The method of claim 20, wherein the method further comprises:

adding a margin to the size of the one or more defects in the mask blank, wherein the addition of the margin is configured to position the one or more defects a select distance from one or more edges of the design pattern.

24. The method of claim 20, wherein the rotation and translation of the mask blank is further configured to avoid placing the one or more defects on the mask blank under design patterns of high complexity.

25. The method of claim 20, wherein the pattern complexity of the design pattern is determined by pattern critical dimension in the defect region of the one or more defects on the mask blank and density of small critical dimension patterns in the defect region of the one or more defects on the mask blank.

26. The method of claim 20, wherein the area of defect exposure of the one or more defects on the mask blank is determined using an accumulated overlapping area of one or more defect regions with exposure regions of the design pattern.

27. The method of claim 20, wherein the non-linear optimization procedure includes Bound Optimization BY Quadratic Approximation (BOBYQA).

28. The method of claim 20, wherein the mask blank includes an extreme ultraviolet blank mask.

29. The method of claim 20, wherein the design pattern is printed on the adjusted mask blank to generate the pattern mask, wherein the pattern mask includes an extreme ultraviolet pattern mask including a multilayer reflector portion and an absorber layer.

30. A method for reducing printable defects on a pattern mask, comprising:

performing inspection of a mask blank to generate a defect map of one or more defects on the mask blank using a characterization sub-system;

generating a cost function based on a first characteristic and a second characteristic, wherein the first characteristic comprises an area of defect exposure of the one or more defects on the mask blank, wherein the second characteristic comprises pattern complexity of a design pattern within a defect region;

determining one or more values indicative of a minimum of the cost function via a non-linear optimization procedure;

determining one or more metrics indicative of how good the mask blank is for the design pattern; and generating one or more control signals to adjust rotation and translation of the mask blank relative to the design pattern based on at least one of the determined one or more values indicative of the minimum of the cost function or the one or more metrics indicative of how good the mask blank is for the design pattern.

31. The method of claim 30, wherein the one or more metrics includes a score between 0 and 1, wherein a score closer to 1 indicates that the adjusted mask with the design pattern is more likely to mitigate the one or more defects in the mask blank.

32. The method of claim 30, wherein the method further comprises:

adding a margin to the size of the one or more defects in the mask blank, wherein the addition of the margin is configured to position the one or more defects a select distance from one or more edges of the design pattern.

33. The method of claim 30, wherein the rotation and translation of the mask blank is further configured to avoid placing the one or more defects on the mask blank under design patterns of high complexity.

34. The method of claim 30, wherein the pattern complexity of the design pattern is determined by pattern critical dimension in the defect region of the one or more defects on the mask blank and density of small-critical dimension patterns in the defect region of the one or more defects on the mask blank.

35. The method of claim 30, wherein the area of defect exposure of the one or more defects on the mask blank is determined using an accumulated overlapping area of one or more defect regions with exposure regions of the design pattern.

36. The method of claim 30, wherein the non-linear optimization procedure includes Bound Optimization BY Quadratic Approximation (BOBYQA).

37. The method of claim 30, wherein the mask blank includes an extreme ultraviolet blank mask.

38. The method of claim 30, wherein the design pattern is printed on the adjusted mask blank to generate the pattern mask, wherein the pattern mask includes an extreme ultraviolet pattern mask including a multilayer reflector portion and an absorber layer.

* * * * *